United States Patent [19]

Carmen et al.

[11] Patent Number: 5,273,151
[45] Date of Patent: Dec. 28, 1993

[54] RESONANT COIL COIN DETECTION APPARATUS

[75] Inventors: Ralph H. Carmen, Lebanon, N.J.; James M. Rodgers, Harrison, Ark.

[73] Assignee: Duncan Industries Parking Control Systems Corp., Harrison, Ark.

[21] Appl. No.: 855,252

[22] Filed: Mar. 23, 1992

[51] Int. Cl.[5] .......................................... G07D 5/08
[52] U.S. Cl. ..................... 194/319; 324/225; 324/236
[58] Field of Search ............ 194/317, 318, 319; 324/234, 236, 225

[56] References Cited

U.S. PATENT DOCUMENTS

| | | |
|---|---|---|
| 2,540,063 | 1/1951 | Victoreen . |
| 2,642,974 | 6/1953 | Ogle . |
| 3,059,749 | 10/1962 | Zinke . |
| 3,242,932 | 3/1966 | Becker . |
| 3,373,856 | 3/1968 | Kusters et al. . |
| 3,378,126 | 4/1968 | Kuckens et al. . |
| 3,587,809 | 6/1971 | Meloni . |
| 3,682,286 | 8/1972 | Prumm . |
| 3,738,469 | 6/1973 | Prumm . |
| 3,796,295 | 3/1974 | Montolivo et al. . |
| 3,901,368 | 8/1975 | Klinger . |
| 3,918,564 | 11/1975 | Heiman et al. . |
| 4,091,908 | 5/1978 | Hayashi et al. . |
| 4,105,105 | 8/1978 | Braum .................. 324/236 |
| 4,108,296 | 8/1978 | Hayashi et al. . |
| 4,124,111 | 11/1978 | Hayashi . |
| 4,128,158 | 12/1978 | Dautremont, Jr. . |
| 4,151,904 | 5/1979 | Levasseur et al. . |
| 4,206,775 | 6/1980 | Tanaka . |
| 4,234,071 | 11/1980 | Le-Hong . |
| 4,286,704 | 9/1981 | Wood . |
| 4,323,148 | 4/1982 | Nichimoto et al. . |
| 4,326,621 | 4/1982 | Davies . |
| 4,353,453 | 10/1982 | Partin et al. ............... 194/319 |
| 4,371,073 | 2/1983 | Dubey . |
| 4,436,196 | 3/1984 | Crisp et al. . |
| 4,437,558 | 3/1984 | Nicholson et al. . |
| 4,460,080 | 7/1984 | Howard . |
| 4,469,213 | 9/1984 | Nicholson et al. . |
| 4,717,006 | 1/1988 | Chapman et al. ............ 194/318 |
| 4,843,259 | 6/1989 | Weisshaupt ............. 324/234 X |

FOREIGN PATENT DOCUMENTS

| | | |
|---|---|---|
| 5473980 | 6/1983 | Australia . |
| 56-11182 | 3/1981 | Japan . |
| 58-6985 | 2/1983 | Japan . |
| 58-30632 | 6/1983 | Japan . |
| 1401363 | 7/1975 | United Kingdom . |
| 2020469 | 11/1979 | United Kingdom . |

*Primary Examiner*—F. J. Bartuska
*Attorney, Agent, or Firm*—James P. Ryther

[57] ABSTRACT

A coin detection apparatus is disclosed which is particularly suitable for low power applications. The coin detection apparatus utilizes a detector coil as part of a resonant circuit. The resonant circuit with no coin present in the detector coil has a damped impulse response. When a coin is present within the detector coil, the damping of the impulse response of the resonant circuit is increased. Periodic generation of an impulse input to the resonant circuit and measurement of the resulting impulse response enables the presence of a coin within the detector coil to be ascertained.

13 Claims, 2 Drawing Sheets

RESONANT COIL COIN DETECTION APPARATUS

FIELD OF THE INVENTION

The present invention relates to methods and devices for detecting the presence of coins as part of, for example, a coin-operated parking meter. The primary objective of such devices is to detect the presence of a coin at the entrance to an electronic coin discriminator so that the discriminator may be activated early enough in the coin trajectory to correctly perform the discrimination function. Common methods for detecting the presence of a coin employed by previous devices include the use of mechanically linked electrical switches and optical light beam interruption switches. The problems associated with mechanically linked electrical switches are that the linkage is subject to jamming due to contamination and wear, and that force is required to activate even a properly operating mechanism. Also, using a single mechanical linkage to detect coins ranging over the sizes found in world currency is at best difficult. The problems associated with optical light beam interruption switches are that contamination may block the light beam, and that to detect the presence of coins ranging over the sizes found in world currency, in a single unit, requires use of multiple light beams and sensors.

SUMMARY OF THE INVENTION

The present invention is a coin detector which employs a detection coil electrically connected as part of a high Q resonator circuit. The coil is configured and positioned such that a coin passes through the coil in the detection process. The length of the coil winding is preferably about the diameter of the smallest coin to be detected (e.g., about 0.69 inch for a U.S. dime). A coin passing through an energized detection coil induces eddy currents in the coin which causes resistive losses so that the resonator circuit impulse response becomes damped. The detection process consists of counting the number of cycles of the resonator circuit impulse response for which the voltage amplitude exceeds a fixed threshold. The damping of the impulse response by a coin lowers the number of such cycles to indicate the presence of a coin.

Since the resonant coil detector makes no contact with the coin in transit, and since the detection coil may be physically separated from the environment, the coin detector is jam proof and environmentally secure. Also, since the detection process depends on the impulse response of the resonant circuit, energy is delivered to the resonant detector as impulses at a relatively low rate, thereby conserving energy.

It is therefore an object of the present invention to be capable of detecting the presence of coins covering the range of sizes found in world-wide currency with a single detection element. It is a further object for the device to provide coin detection with very low power consumption in an environmentally secure configuration. Other objects, features, and advantages of the invention will become evident in light of the following detailed description considered in conjunction with the referenced drawings of a preferred exemplary embodiment according to the present invention.

DETAILED DESCRIPTION OF THE INVENTION

Figure 1:
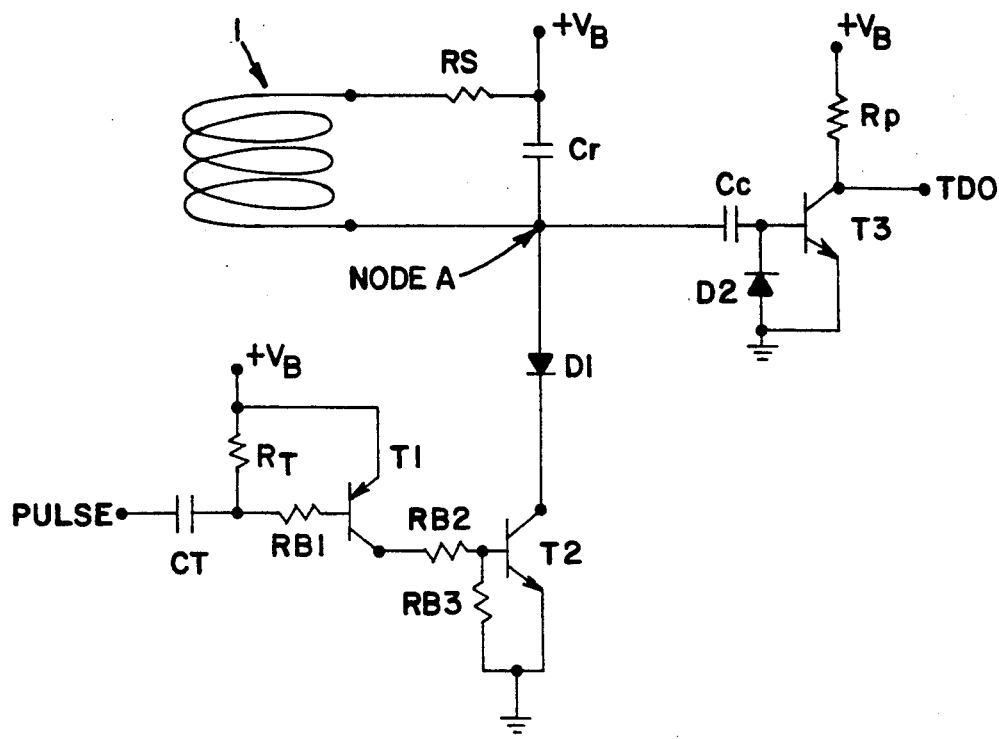
FIG. 1 is a schematic of a coin detector circuit in accordance with the present invention showing the detector coil.

FIG. 1 is a schematic showing the detection coil and its incorporation into an exemplary resonant circuit. The detection coil is placed at the coin entrance so that an inserted coin will pass through it before passing on to a coin discrimination system. The resonant circuit shown in FIG. 1 comprises the detection coil 1 and resonating capacitor $C_r$. $R_s$ is included to represent series resistive losses in the detector coil 1, and other parasitic losses. A drive section consisting of transistors T1 and T2, resistors RB1, RB2 & RB3, the RT-CT input forming pair and coupling diode D1 is provided for producing an impulse input to the resonant circuit. The output of the resonant circuit is fed to a threshold detector circuit consisting of T3 and D2, coupling capacitor $C_c$ and pull-up resistor $R_p$.

When the PULSE input to the drive circuit is brought to ground, an impulse of current flows through the D1 coupling diode to the detector coil 1 and $C_r$ resonant pair. The duration of this impulse is controlled by the driver RT-CT input forming pair. In one specific embodiment, the duration is about 5 microseconds. The subsequent resonant circuit impulse response voltage at node A is coupled to the threshold detector transistor T3 by coupling capacitor $C_c$. The output of the threshold detector circuit TDO is a square wave at the resonant frequency of the resonant circuit for as long as the amplitude at node A exceeds the forward junction voltage of transistor T3.

The voltage at node A, $V_A(t)$, is equal to the voltage across capacitor $C_r$, $V_c(t)$, and is given by:

$$V_A(t) = V_c(t) = V_p \exp(-R_s t/2L) \cdot \sin(wt + \phi)$$

where w, the resonant frequency, is given by:

$$w = \sqrt{1/LC_r - (R_s/2L)^2}$$

where L is the inductance of the detection coil 1, t is time referenced to cessation of the impulse drive, and $\phi$ is a phase angle dependent on the initial condition of the resonant circuit.

$V_p$, the peak resonant voltage, is dependent on the length of the drive impulse and on the inductance L, which two parameters dominate the initial resonant circuit condition. This voltage must be limited to avoid circuit malfunction due to a breakdown of drive transistor T2. The peak voltage is determined by reference to initial circuit conditions (capacitor voltage $V_c(0)$ and inductor current $I_L(0)$):

$$V_c(0) = V_p \sin(\phi)$$

$$dV_c(0)/dt = V_p w \cos(\phi) - V_p(R_s/2L) \sin(\phi)$$
$$= V_p w \cos(\phi) - (R_s/2L) V_c(0)$$

The time derivative of the voltage at node A when t=0 is determined by the initial current in the inductor L and by the value of $C_r$ according to:

$$dV_c(0)/dt = I_L(0)/C_r$$

So by substitution:

$$V_c(0)^2 + (I_L(0)/w \, C_r + R_s V_c(0)/w \, 2L)^2 =$$
$$V_p^2 \cos^2(\phi) + V_p^2 \sin^2(\phi) = V_p^2$$

In the present circuit, when the drive is turned on, the resonant capacitor is connected across the supply $V_B$ so $V_c(0)=V_B$. The initial inductor current is determined from the supply voltage and the inductance L, and the time of the drive impulse by:

$$I_L(0) = V_B t_{pulse}/L$$

$V_p$ can then be determined from circuit values. The phase is also determined as:

$$\phi = \arcsin(V_B/V_p)$$

In one specific embodiment, the following component values were used:
L=12.9 mh
$R_s$=91 ohms (detection coil 1 resistance)
$C_r$=0.001 µf
$V_B$=9 v
$t_{pulse}$=5 µs The resulting value of w is 278000 radians per second and the resulting value of $V_p$ as determined from the above derivation is 15.5 volts, this being well within the breakdown limits for most common transistors.

After the impulse drive is removed, the amplitude envelope of the resonant damping voltage will follow:

$$V_{env} = V_p \exp(-R_s t/2L)$$

This will reach the threshold voltage of detector transistor T3, $V_{th}$, when:

$$V_{th} = V_p \exp(-R_s t/2L)$$

or in a time:

$$t = 2L/R_s \ln(V_p/V_{th})$$

With other values taken from the above specific embodiment and the detection threshold $V_{th}$ approximated to be 0.6 volts:

$$t = 0.084/R_s = 922 \text{ microseconds}$$

or about 41 cycles of the damped resonant voltage waveform. Parasitic losses due to lossy materials in range of the detector coil 1, detector coil 1 radiation, and energy absorbed by the detector circuit reduce the actual damping time in practice to about half this number or 20 cycles of damped resonance.

Figure 2A:
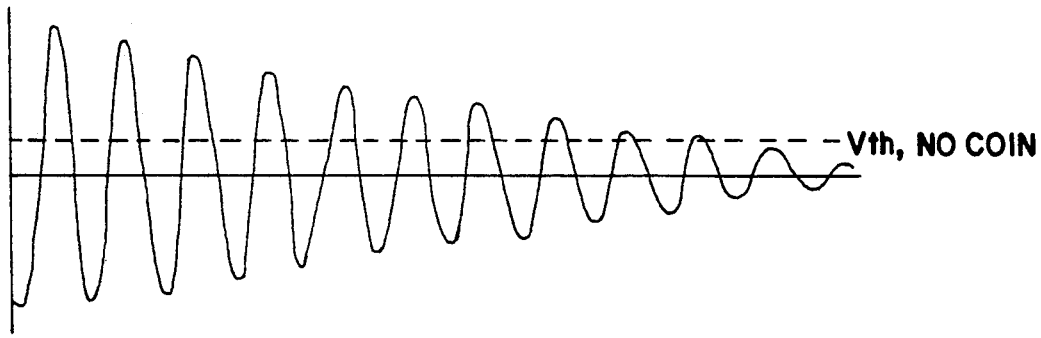
FIG. 2a shows a characteristic impulse response of the resonant circuit of the coin detector without a coin in the detection coil and FIG. 2b shows the response with a coin in the detection coil.
Figure 2B:
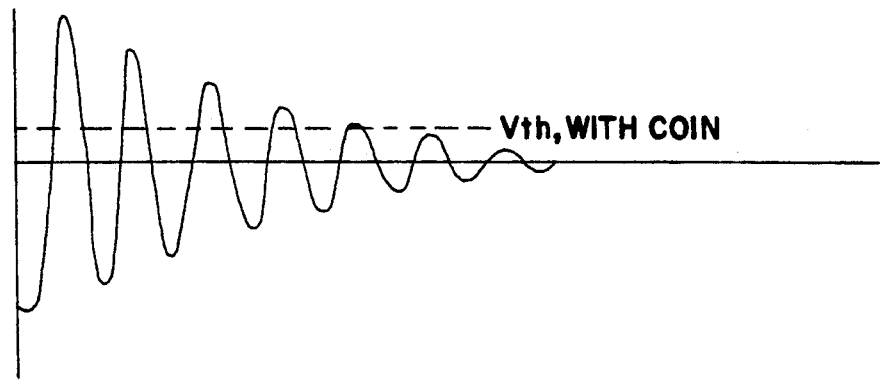

With no coin in the detection coil 1, the resonant damped impulse response will then last for some large number of cycles before the amplitude drops below $V_{th}$ as depicted in FIG. 2a. When a coin is inserted into the detection coil 1, the losses due to eddy currents in the coin material cause an increase in the effective value of $R_s$, thereby increasing the damping and reducing the number of cycles with amplitude above $V_{th}$ as depicted in FIG. 2b.

Figure 3:
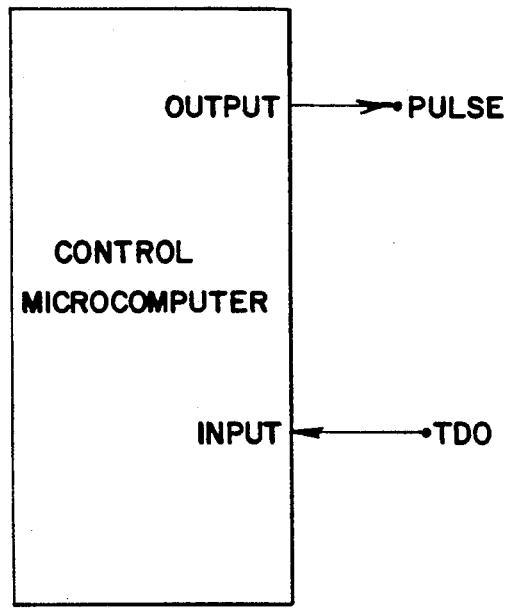
FIG. 3 shows a simple connection of the coin detector to a system microprocessor.

In a preferred application, the resonant coil coin detector of FIG. 1 is connected to a microcomputer as shown in FIG. 3 which periodically engages the PULSE input to the drive circuit, and counts the pulses of the threshold detector circuit output TDO to determine the number of cycles of the damped impulse response with amplitude above $V_{th}$, that number designated COUNT.

In one specific embodiment, the PULSE input is engaged each 25 ms so that the net current consumed by the detector is the average current in the inductor (½ the peak current) during impulse drive, times the drive duty cycle, or:

$$I_L(0)/2 = 3.5ma/2 = 1.75ma$$

consumed at a duty cycle of:

$$t_{pulse}/25ms = 0.0002$$

or:

$$1.75 \, ma * 0.0002 = 0.35 \text{ microamperes}$$

This low level of current enables the coin detector to be applied in battery powered coin acceptors.

A further function of the microcomputer of FIG. 3 is to compensate for variations in the number of cycles of the coin detector output COUNT resulting from changes in $V_{th}$ due to temperature variation and changes in the battery voltage $V_B$ due to temperature variation and aging. As has been described, the number of cycles of damped resonance with amplitude exceeding $V_{th}$ will depend on $V_{th}$ and on $V_p$ which is a function of $V_B$. Temperature changes and aging effects take place over relatively long periods of time, so an algorithm executed by the microcomputer can differentiate changes in the detector output COUNT due to these environmental effects from the sudden decrease in output COUNT due to insertion of a coin into detector coil 1.

Figure 4:
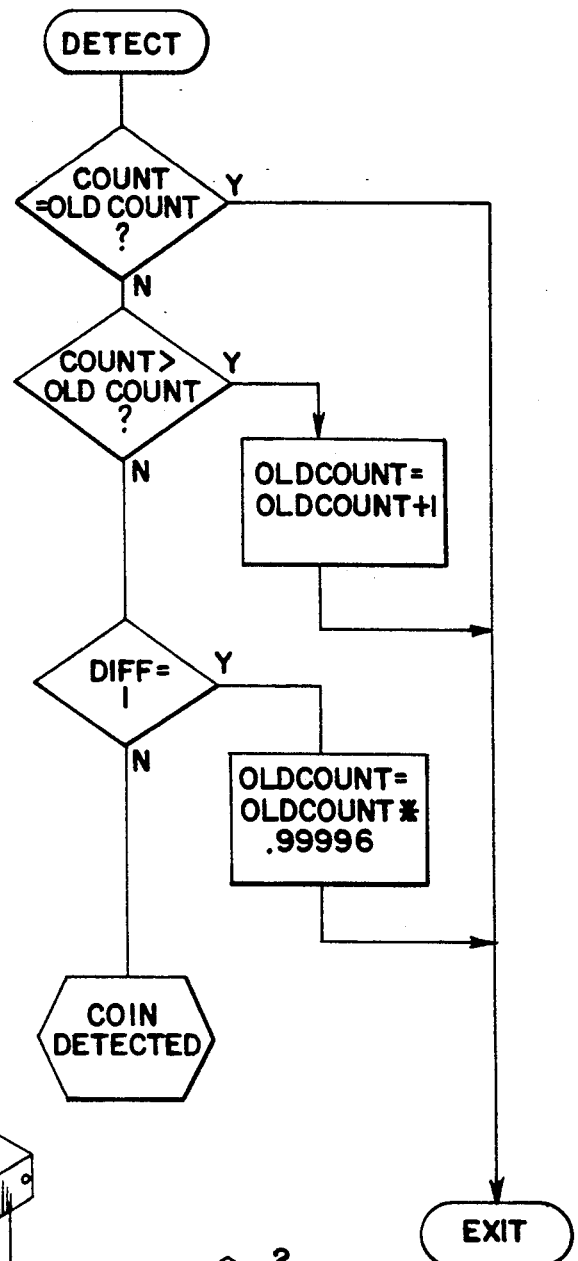
FIG. 4 shows a flow diagram of the adaptive detection algorithm.

A flow diagram for one specific embodiment of this algorithm is shown in FIG. 4. The microcomputer keeps a value OLDCOUNT which is a function over time of the value of the detector COUNT observed on successive periodic activations of the coin detector. This specific embodiment of the algorithm can be described by:

```
If the present COUNT = OLDCOUNT then exit.
If the present COUNT > OLDCOUNT then
   OLDCOUNT = OLDCOUNT + 1, and exit.
If the present COUNT < OLDCOUNT then
   If the difference is 1 then
   OLDCOUNT = OLDCOUNT * .99996 and exit.
   Else, a coin has been detected.
```

In order for a coin to be detected, the COUNT must be at least 2 less than the OLDCOUNT. In cases where a difference of 1 is observed, the algorithm adapts to the change quickly for positive changes, but very slowly for negative changes. This is optimal for detection sensitivity over slowly varying environmental conditions.

As mentioned previously, parasitic losses due to lossy materials in range of the detector coil 1, coil radiation losses, and energy absorbed by the detector circuit reduce the detector damping time in practice to about half the theoretical number. This reduced damping time results in decreased detector sensitivity. Maximizing detector sensitivity is particularly important when small low loss coins, such as the U.S. dime, are to be detected.

Figure 5:
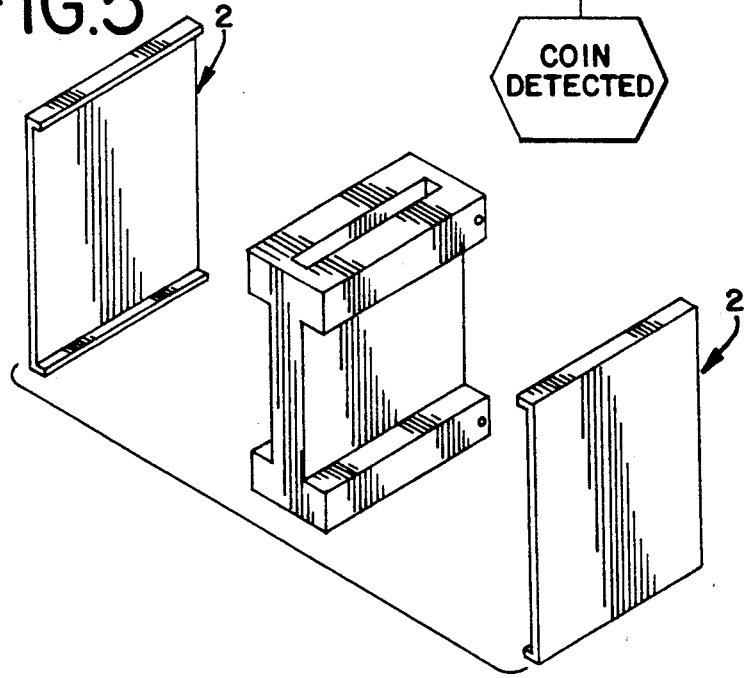
FIG. 5 shows the detector coil with a shield.

In order to maximize detector sensitivity in practice, the detector coil 1 is enclosed by a shield that is made of a high permeability, low loss material such as ferrite. In one specific embodiment, as shown in FIG. 5, the ferrite shield 2 is made with a thickness of 0.050 inch. Enclosing the detector coil 1 in the ferrite shield directs the majority of coil leakage flux through the shield, this leakage flux thereby contributing virtually no eddy current loss to the detector. Thus, the only leakage flux interacting with external lossy materials is through the coin slot at the ends of the coil.

Although the invention has been described in conjunction with the foregoing specific embodiment, many alternatives, variations, and modifications will be apparent to those of ordinary skill in the art. Those alternatives, variations, and modifications are intended to fall within the scope of the following appended claims.

What is claimed is:

1. A coin detection apparatus, comprising:
   a detector coil arranged so that a coin deposited into the apparatus passes through the detector coil to thereby increase losses in the coil due to induced eddy currents in the coin when the coil is energized;
   a resonant circuit incorporating the detector coil which outputs a damped, time-limited cyclic signal in response to an impulse input;
   a drive circuit for generating an impulse input to the resonant circuit to thereby produce a cyclic output signal from the resonant circuit, the damping of the cyclic output signal being increased when a coil is present within the detector coil to thereby indicate the coin's presence;
   means for counting the cycles of the resonant circuit output in response to the impulse input, the number of cycles counted being indicative of whether or not a coin is present within the detector coil, said counting means counting the resonant circuit output cycles for a predetermined length of time after application of the impulse input signal, the counting means counting only those output cycles exceeding an amplitude threshold; said amplitude threshold varying depending on changes in environmental conditions including temperature and aging; and,
   means for varying the number of cycles counted to indicate the presence of a coin to compensate for such changes in the environmental conditions.

2. The coin detection apparatus as set forth in claim 1 further comprising a threshold detector circuit for receiving the output of the resonant circuit, the threshold detector circuit producing a pulse for each resonant circuit output cycle which exceeds a predetermined amplitude threshold, the number of such pulses being less when a coin is present in the detector coil due to the damping of the resonant circuit output.

3. The coin detection apparatus as set forth in claim 2 further comprising means for counting the pulses of the threshold detector circuit for a predetermined length of time after application of the impulse input, the resulting pulse count being less when a coin is present within the detector coil.

4. The coin detection apparatus as set forth in claim 3 further comprising means for enabling the drive circuit to periodically generate an impulse input to the resonant circuit.

5. The coin detection apparatus as set forth in claim 4 further comprising means for comparing a present pulse count with an old pulse count where the old pulse count is a function over time of the value of the pulse count observed after successive applications of the impulse input, to ascertain the presence of a coin within the detector coil.

6. The detection apparatus as set forth in claim 5 wherein the comparing means increments the old pulse count by one when the present pulse count is greater than the old pulse count, reduces the old pulse count to fraction of its former value when the old pulse count exceeds the present pulse count by one, and indicates the presence of a coin when the old pulse count exceeds the present pulse count by more than one.

7. The detection apparatus as set forth in claim 3 further comprising means for shielding the detector coil from external lossy influence.

8. The coin detection apparatus as set forth in claim 7 wherein the shielding means is a shield constructed from a low loss, high permeability material.

9. The coin detection apparatus as set forth in claim 8 wherein the shield is constructed of ferrite.

10. A coin detection apparatus, comprising:
    a detector coil arranged so that a coin deposited into the apparatus passes through the detector coil to thereby increase losses in the coil due to induced eddy currents in the coin when the coil is energized;
    a resonant circuit incorporating the detector coil which outputs a damped, time-limited cyclic signal in response to an impulse input;
    a drive circuit for generating an impulse input to the resonant circuit to thereby produce a cyclic output signal from the resonant circuit, the damping of the cyclic output signal being increased when a coin is present within the detector coil to thereby indicate the coin's presence;
    a threshold detector circuit for receiving the output of the resonant circuit, the threshold detector circuit producing a pulse for each resonant circuit output cycle which exceeds a predetermined amplitude threshold, the number of such pulses being less when a coin is present in the detector coil due to the damping of the resonant circuit output;
    means for counting the pulses of the threshold detector circuit for a predetermined length of time after application of the impulse input, the resulting pulse count being less when a coin is present within the detector coil;
    means for enabling the drive circuit to periodically generate an impulse input to the resonant circuit;
    means for comparing a present pulse count with an old pulse count where the old pulse count is a function over time of the value of the pulse count observed after successive applications of the impulse input, to ascertain the presence of a coin within the detector coil, and wherein the comparing means increments the old pulse count by one when the present pulse count is greater than the old pulse count, reduces the old pulse count to a fraction of its former value when the old pulse count exceeds the present pulse count by one, and indicates the presence of a coin when the old pulse count exceeds the present pulse count by more than one.

11. The coin detection apparatus as set forth in claim 10 further comprising:

means for counting the cycles of the resonant circuit output in response to the impulse input, the number of cycles counted being indicative of whether or not a coin is present within the detector coil.

12. The coin detection apparatus as set forth in claim 11 wherein the resonant circuit output cycles are counted for a predetermined length of time after application of the impulse input signal.

13. The coin detection apparatus as set forth in claim 12 wherein the counting means counts only those output cycles exceeding a predetermined amplitude threshold.

* * * * *